United States Patent
Haldar

(10) Patent No.: US 9,087,038 B1
(45) Date of Patent: Jul. 21, 2015

(54) MESSAGING WITH SHORTCUT CHARACTER STRINGS

(75) Inventor: Debashis Haldar, Olathe, KS (US)

(73) Assignee: Sprint Communications Company L.P., Overland Park, KS (US)

(*) Notice: Subject to any disclaimer, the term of this patent is extended or adjusted under 35 U.S.C. 154(b) by 745 days.

(21) Appl. No.: 12/840,635

(22) Filed: Jul. 21, 2010

(51) Int. Cl.
- G08B 5/22 (2006.01)
- H04Q 1/30 (2006.01)
- G06F 17/27 (2006.01)
- H04W 4/18 (2009.01)
- H04M 1/725 (2006.01)
- H04W 4/14 (2009.01)
- G06F 17/22 (2006.01)
- H04L 12/58 (2006.01)
- H04W 4/12 (2009.01)
- H04W 88/18 (2009.01)
- G06F 17/24 (2006.01)

(52) U.S. Cl.
CPC ............ *G06F 17/27* (2013.01); *G06F 17/22* (2013.01); *G06F 17/24* (2013.01); *H04L 12/586* (2013.01); *H04M 1/72552* (2013.01); *H04W 4/12* (2013.01); *H04W 4/14* (2013.01); *H04W 4/18* (2013.01); *H04W 88/184* (2013.01)

(58) Field of Classification Search
CPC ......... G06F 17/27; G06F 17/22; G06F 17/24; H04M 1/72552; H04W 4/14; H04W 88/184; H04W 4/12; H04W 4/18; H04L 12/586
USPC .............. 340/7.51, 7.33, 7.52, 7.56, 12.54; 455/466, 414
See application file for complete search history.

(56) References Cited

U.S. PATENT DOCUMENTS

| | | | | |
|---|---|---|---|---|
| 6,047,298 | A * | 4/2000 | Morishita | 715/236 |
| 6,061,398 | A * | 5/2000 | Satoh et al. | 375/240 |
| 6,100,824 | A * | 8/2000 | MacLeod et al. | 341/51 |
| 6,377,966 | B1 * | 4/2002 | Cooper et al. | 715/263 |
| 7,098,919 | B2 * | 8/2006 | Kim | 345/467 |
| 7,177,629 | B1 * | 2/2007 | Deeds | 455/415 |
| 7,315,902 | B2 * | 1/2008 | Kirkland | 709/247 |
| 7,490,130 | B2 * | 2/2009 | Hosono | 709/206 |
| 7,646,317 | B2 * | 1/2010 | Chen | 341/50 |
| 7,949,714 | B1 * | 5/2011 | Burnim | 709/206 |
| 8,532,680 | B2 * | 9/2013 | Park et al. | 455/466 |
| 2002/0184270 | A1 * | 12/2002 | Gimson | 707/529 |
| 2003/0003931 | A1 * | 1/2003 | Silventoinen et al. | 455/466 |
| 2003/0139921 | A1 * | 7/2003 | Byrd et al. | 704/10 |
| 2004/0122979 | A1 * | 6/2004 | Kirkland | 709/247 |
| 2005/0240391 | A1 * | 10/2005 | Lekutai | 704/2 |
| 2006/0007159 | A1 * | 1/2006 | Lane et al. | 345/168 |
| 2006/0242191 | A1 * | 10/2006 | Kutsumi et al. | 707/102 |

(Continued)

FOREIGN PATENT DOCUMENTS

EP  1262931 A1 * 12/2002 ............ G08B 5/22

*Primary Examiner* — Benjamin Lee
*Assistant Examiner* — Quang D Pham

(57) ABSTRACT

A method, system, and medium are provided for increasing the amount of content that can be displayed to a message recipient relative to the amount of information transmitted. This can be accomplished by identifying series of characters that can be replaced by a shortcut character string. Although both the sender and the recipient can see the full text of a message, the amount of data transmitted can be reduced based on the difference in the number of characters in the full message relative to the number of characters after replacement of identified series of characters with shortcut character strings.

20 Claims, 11 Drawing Sheets

(56) References Cited

U.S. PATENT DOCUMENTS

| | | | |
|---|---|---|---|
| 2006/0247917 A1* | 11/2006 | Fux et al. | 704/9 |
| 2007/0087766 A1* | 4/2007 | Hardy et al. | 455/466 |
| 2007/0173267 A1* | 7/2007 | Klassen et al. | 455/466 |
| 2007/0266090 A1* | 11/2007 | Len | 709/204 |
| 2008/0114591 A1* | 5/2008 | Williamson | 704/10 |
| 2008/0126077 A1* | 5/2008 | Thorn | 704/8 |
| 2008/0266263 A1* | 10/2008 | Motaparti et al. | 345/169 |
| 2008/0313164 A1* | 12/2008 | Lee et al. | 707/5 |
| 2009/0037170 A1* | 2/2009 | Williams | 704/235 |
| 2009/0075681 A1* | 3/2009 | Jager | 455/466 |
| 2009/0112642 A1* | 4/2009 | Uekane et al. | 705/7 |
| 2009/0117922 A1* | 5/2009 | Bell et al. | 455/466 |
| 2009/0176521 A1* | 7/2009 | Klassen et al. | 455/466 |
| 2010/0070275 A1* | 3/2010 | Cast | 704/235 |
| 2010/0145676 A1* | 6/2010 | Rogers | 704/9 |
| 2010/0211787 A1* | 8/2010 | Bukshpun et al. | 713/170 |
| 2010/0255816 A1* | 10/2010 | Varadarajan | 455/412.1 |
| 2010/0262604 A1* | 10/2010 | Akaboshi | 707/737 |
| 2011/0016110 A1* | 1/2011 | Egi et al. | 707/723 |
| 2011/0131207 A1* | 6/2011 | Jonsson | 707/730 |

* cited by examiner

| 32. | 33. ! | 34. " | 35. # | 36. $ | 37. % | 38. & | 39. ' | 40. ( | 41. ) | 42. * | 43. + | 44. , | 45. - | 46. . | 47. / |
|---|---|---|---|---|---|---|---|---|---|---|---|---|---|---|---|
| 48. 0 | 49. 1 | 50. 2 | 51. 3 | 52. 4 | 53. 5 | 54. 6 | 55. 7 | 56. 8 | 57. 9 | 58. : | 59. ; | 60. < | 61. = | 62. > | 63. ? |
| 64. @ | 65. A | 66. B | 67. C | 68. D | 69. E | 70. F | 71. G | 72. H | 73. I | 74. J | 75. K | 76. L | 77. M | 78. N | 79. O |
| 80. P | 81. Q | 82. R | 83. S | 84. T | 85. U | 86. V | 87. W | 88. X | 89. Y | 90. Z | 91. [ | 92. \ | 93. ] | 94. ^ | 95. _ |
| 96. ` | 97. a | 98. b | 99. c | 100. d | 101. e | 102. f | 103. g | 104. h | 105. i | 106. j | 107. k | 108. l | 109. m | 110. n | 111. o |
| 112. p | 113. q | 114. r | 115. s | 116. t | 117. u | 118. v | 119. w | 120. x | 121. y | 122. z | 123. { | 124. | | 125. } | 126. ~ | |

*FIG. 9*

| 0. NUL | null | 8. BS | backspace | 16. DLE | data link escape | 24. CAN | cancel |
|---|---|---|---|---|---|---|---|
| 1. SOH | start of heading | 9. HT | Horizontal tabulation | 17. DC1 | device control 1 | 25. EM | end of medium |
| 2. STX | start of text | 10. LF | line feed | 18. DC2 | device control 2 | 26. SUB | substitute |
| 3. ETX | end of text | 11. VT | Vertical tabulation | 19. DC3 | device control 3 | 27. ESC | escape |
| 4. EOT | end of transmission | 12. FF | form feed | 20. DC4 | device control 4 | 28. FS | file separator |
| 5. ENQ | enquiry | 13. CR | Carriage return | 21. NAK | negative acknowledge | 29. GS | group separator |
| 6. ACK | acknowledge | 14. SO | shift out | 22. SYN | synchronous idle | 30. RS | record separator |
| 7. BEL | bell | 15. SI | shift in | 23. ETB | end of transmission block | 31. US | unit separator |
| | | | | | | 127. DEL | delete |

*FIG. 10*

| 128. € | 136. ˆ | 144. | 152. ˜ | 160. | 168. ¨ | 176. ° | 184. ¸ |
| 129. | 137. ‰ | 145. ' | 153. ™ | 161. ¡ | 169. © | 177. ± | 185. ¹ |
| 130. ‚ | 138. Š | 146. ' | 154. š | 162. ¢ | 170. ª | 178. ² | 186. º |
| 131. ƒ | 139. ‹ | 147. " | 155. › | 163. £ | 171. « | 179. ³ | 187. » |
| 132. „ | 140. Œ | 148. " | 156. œ | 164. ¤ | 172. ¬ | 180. ´ | 188. ¼ |
| 133. … | 141. | 149. • | 157. | 165. ¥ | 173. - | 181. µ | 189. ½ |
| 134. † | 142. Ž | 150. – | 158. ž | 166. ¦ | 174. ® | 182. ¶ | 190. ¾ |
| 135. ‡ | 143. | 151. — | 159. Ÿ | 167. § | 175. ¯ | 183. · | 191. ¿ |

| 192. Â | 199. Ç | 204. Ì | 208. Ð | 215. × | 217. Û | 221. Ý |
| 193. Á | 200. È | 205. Í | 209. Ñ | 216. Ø | 218. Ú | 222. Þ |
| 194. Â | 201. É | 206. Î | 210. | 219. Û | 223. ß |
| 195. Ã | 202. Ê | 207. Ï | 211. | 220. Ü | |
| 196. Ä | 203. Ë | | 212. | | | |
| 197. Å | | | 213. | | | |
| 198. Æ | | | 214. | | | |

| 224. à | 231. ç | 236. ì | 240. ð | 247. ÷ | 249. ù | 253. ý |
| 225. á | 232. è | 237. í | 241. ñ | 248. ø | 250. ú | 254. þ |
| 226. â | 233. é | 238. î | 242. ò | | 251. û | 255. ÿ |
| 227. ã | 234. ê | 239. ï | 243. ó | | 252. ü | |
| 228. ä | 235. ë | | 244. ô | | | |
| 229. å | | | 245. õ | | | |
| 230. æ | | | 246. ö | | | |

FIG. 11

MESSAGING WITH SHORTCUT CHARACTER STRINGS

BACKGROUND

One method for communicating between devices are message services, such as the short message service (SMS) available on many mobile devices. Short message service messages provide a convenient way for users to communicate, but as the name implies, the length of each message is limited.

SUMMARY

Embodiments of the invention are defined by the claims below, not this summary. A high-level overview of various aspects of the invention are provided here for that reason, to provide an overview of the disclosure, and to introduce a selection of concepts that are further described below in the detailed-description section below. This summary is not intended to identify key features or essential features of the claimed subject matter, nor is it intended to be used as an aid in isolation to determine the scope of the claimed subject matter.

In brief, and at a high level, systems and methods are provided for increasing the amount of content that can be displayed to a message recipient relative to the amount of information transmitted. This can be accomplished by identifying series of characters that can be replaced by a shortcut character string. Although both the sender and the recipient can see the full text of a message, the amount of data transmitted can be reduced based on the difference in the number of characters in the full message relative to the number of characters after replacement of identified series of characters with shortcut character strings.

BRIEF DESCRIPTION OF THE SEVERAL VIEWS OF THE DRAWINGS

Illustrative embodiments of the present invention are described in detail below with reference to the attached drawing figures, and wherein:

FIG. 9 shows an example of ASCII assignments for standard keyboard characters.

FIG. 10 shows an example of ASCII assignments for extended keyboard characters.

FIG. 11 shows another example of ASCII assignments for extended keyboard characters.

DETAILED DESCRIPTION

Figure 1:
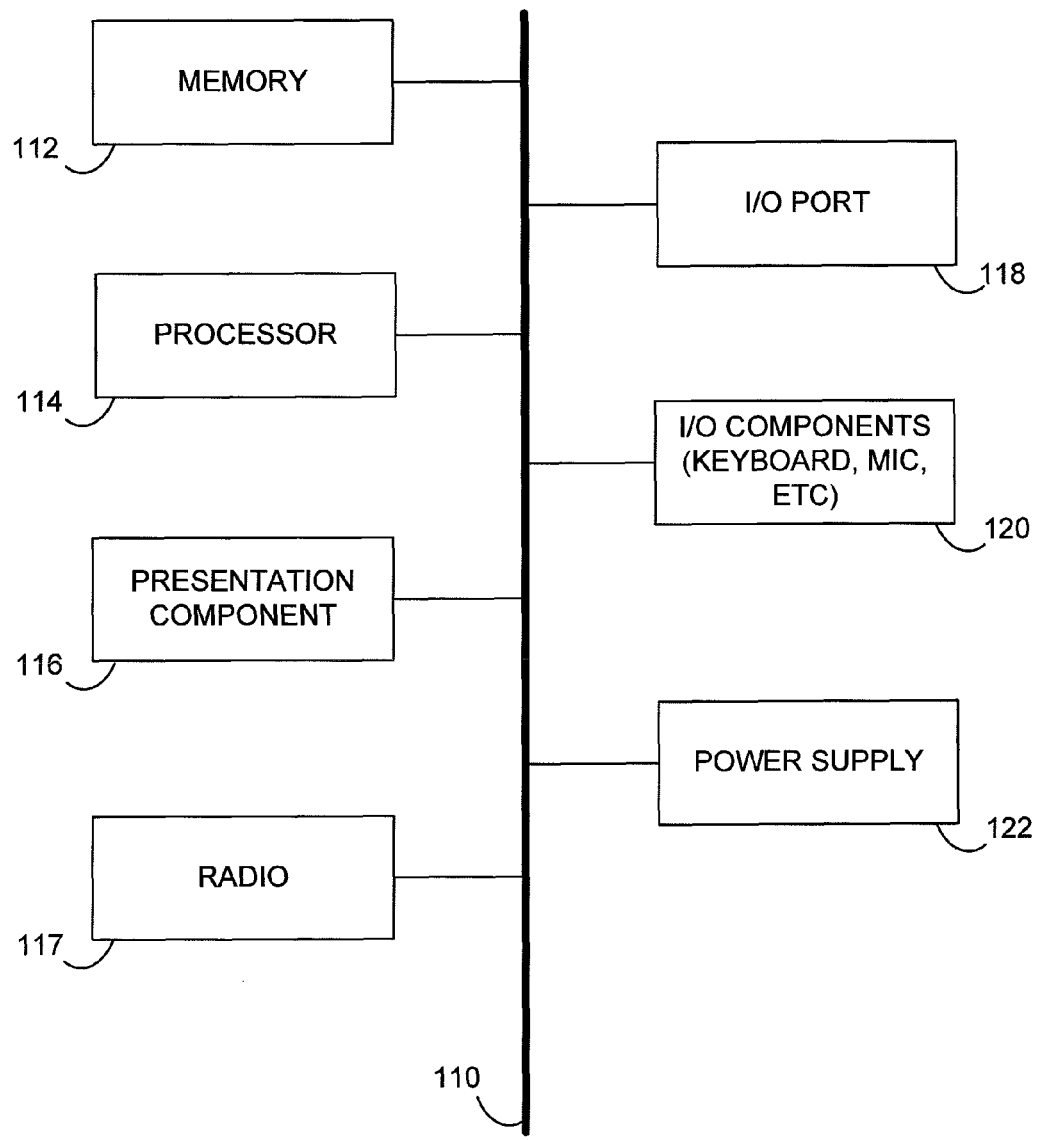
FIG. 1 schematically depicts a general mobile device or other computing device in accordance with an embodiment of the invention.

The subject matter of embodiments of the present invention is described with specificity herein to meet statutory requirements. But the description itself is not intended to necessarily limit the scope of claims. Rather, the claimed subject matter might be embodied in other ways to include different steps or combinations of steps similar to the ones described in this document, in conjunction with other present or future technologies. Terms should not be interpreted as implying any particular order among or between various steps herein disclosed unless and except when the order of individual steps is explicitly described.

Various technical terms are used throughout this description. An illustrative resource that fleshes out various aspects of these terms can be found in Newton's Telecom Dictionary by H. Newton, 24th Edition (2008).

Overview

In various embodiments, systems and methods are provided for increasing the amount of information that can be delivered within a message. In such embodiments, this can be achieved by replacing a commonly occurring series of consecutive characters with shortcut character strings. At least one shortcut character in a shortcut character string can be selected from characters that are not commonly available on a mobile device, but that are recognized as part of a standard character set, such as a 7-bit ASCII character set. For example, the first character in a shortcut character string can be a character that is not commonly available on a mobile device.

In an embodiment, as a message is being typed into a device by a user, series of consecutive characters can be identified that have a matching shortcut character or character string. The identified series can be replaced with the matching shortcut character as the user is continuing to type the message. The replacement can reduce the number of characters in the message, thus allowing the user to type additional characters without exceeding a target message length. For example, replacing a longer series of characters with a shortcut character or shortcut character string can allow a sender of an SMS message to send, as a single message, a message that would normally exceed the 160 character limit for a single message. After replacement of identified character strings, the message can be forwarded to a recipient. At the recipient, the shortcut character strings are converted back into the identified character strings. Thus, both the sender and the receiver can view a full text message without having to be aware of the meaning of the corresponding shortcut character or shortcut character string. It is noted that in various embodiments, use of shortcut characters or shortcut character strings does not result in loss of information. This is in contrast to, for example, lossy 7-bit encoding, where characters with an accent or other type of additional mark (such as the character Å) might be converted to the corresponding letter without accent or mark (such as A). In such lossy encoding, the recipient of the message would see only the letter without the accent or mark.

The character strings that have an associated shortcut character string can be identified in advance. Using a pre-defined list can allow the shortcut character strings to be distributed to user devices in advance, such as at the time of sale.

Alternatively, the association of shortcut characters or shortcut character strings can be dynamic. One option can be for a pair of mobile devices (or other type of message sending devices) to monitor traffic between the devices. The pair of message sending devices can identify series of characters that are commonly sent by the users of those devices. The identified series can then be agreed on, along with an assignment of a shortcut character string. After this agreement, messages sent between the pair of devices can have increased content, as the longer identified series of characters can be replaced with a shortcut character or shortcut character string. Of course, an activity that can occur between a pair of devices could just as easily occur between any number of devices that have agreed to share a common listing of shortcut character strings. Still another option for dynamic assignment is to have one or more central servers monitor message traffic for common series of characters. The central servers can then assign or associate shortcut character strings and push a listing of identified series to message sending devices for future use.

In the discussion below, reference will be made to shortcut character strings. Those of skill in the art will understand that this includes a use of a single character as a shortcut character string. Unless explicitly noted otherwise, any description of use of a shortcut character string includes an embodiment where a single shortcut character is used as the shortcut character string.

In the discussion below, reference will be made to messaging devices. The references can include sending devices and recipient devices. To simplify the description, many of the embodiments will be described in terms of messages between devices. However, those of skill in the art will recognize that a messaging device (such as a sending or receiving device) can be substituted with a messaging interface or an identity at a messaging interface. For example, some short message service messages are sent and/or received by mobile devices, such as cell phones, smart phones, or other devices with similar capabilities. The sending and/or receiving of a message is a feature integrated with the capabilities of the device. Other short message service messages can be sent and/or received via an interface, such as an interface hosted by a web page or web service. Such an interface may be accessible via a mobile device, or by other devices that can connect to a suitable network. Typically, access via an interface involves an account or some other form of identification, so that the sender or recipient can be identified for proper message delivery. A messaging participant is defined to include either a messaging device or an identity on a messaging interface.

Standard and Extended Keyboard Characters

Many messages are sent from mobile and/or hand-held devices. While standard alphabetic and numerical characters are typically available on such devices, the keyboards of such devices may not include keys to allow for entry of all available characters in the character encoding set being used by the SMS service. For example, the character "control-A", or ASCII character 1, is a standard character within a 7-bit ASCII character set. Note that in some other descriptions, ASCII character 1 can be referred to in another manner. For example, ASCII character 1 in Unicode is the "Start of Heading (SOH)" character. However, control characters such as "control-A" are rarely used in SMS messages, in part because such characters can be difficult to input on a standard mobile or handheld device, and in part because such characters often are not printed or otherwise displayed by a device. Such "non-printing" characters are one group of extended keyboard characters that can be used to form a replacement or shortcut character strings.

In the discussion below, characters such as the numbers 0-9 and the upper and lower case letters A-Z will be referred to as standard keyboard characters. FIG. 9 includes a listing of the various characters that currently represent standard keyboard characters. However, it is noted that the definition of standard keyboard characters can change over time, as mobile devices continue to develop.

Extended keyboard characters are defined herein as characters that are part of a character encoding set but that are not part of the standard keyboard characters. The number of extended keyboard characters can vary depending on the character encoding set. For example, a CDMA based short message service uses a 7-bit ASCII encoding. This provides 128 total characters that can be encoded. By contrast, a short message service in IDEN uses 8-bit encoding, so that 256 characters are included in the encoding.

FIGS. 10 and 11 depict examples of characters that can represent extended keyboard characters. FIG. 10 shows possible assignments for ASCII characters 0-31 and 127, which can be part of a 7-bit encoding. Note that an alternative assignment for ASCII characters 1-26 is to assign these characters as "control-A" through "control-Z". In FIG. 10, another group of alternative assignments can be for characters 9, 11-14, and 30-31. ASCII 9 can be defined as "tab". ASCII 11-14 can be defined as "New Line", "Page Break", "Paragraph", and "Column Break", respectively. Characters 30 and 31 can be defined as "Non-Breaking Hyphen" and "Optional Hyphen", respectively.

It is noted that ASCII characters 17-20 correspond to device control characters in a Unicode encoding. These non-printable characters may also be used for a shortcut character string, even though a device specific encoding may be in place. This is due to the fact that the replacement with shortcut character strings can occur at the application level, and therefore the device driver assignments will typically not be applicable.

FIG. 11 shows potential assignments for ASCII characters 128-255, which additional extended keyboard characters that may be available in an 8-bit encoding scheme. While the characters in FIG. 11 could be printable on some devices, the characters are not included on many mobile devices. The characters in FIG. 11 may also not be supported in various messaging services. Note that the assignment for ASCII character 160 corresponds to "Non-Breaking Space".

In an embodiment, a shortcut character and/or character string can include at least one character that is not included in the standard keyboard characters. In another embodiment, a shortcut character string can include at least one extended keyboard character. Optionally, at least the first character in a shortcut character string can be a character not included in the standard keyboard characters and/or a character that is an extended keyboard character. In still another embodiment, all characters in a shortcut string can be characters not included in the standard keyboard characters.

The number of characters in an identified series that is associated with a shortcut string can theoretically be any number, so long as the identified series contains more characters than the shortcut string. Optionally, it may be desirable to have a more restrictive definition for what series of characters can be identified for association with a shortcut string. For example, for a shortcut string containing a single character (such as "control-A"), the identified series can include at least about 5 characters, or at least about 10 characters, or at least about 15 characters. Alternatively, the identified series can include at least one separator character, such as the "space" character, or at least two separator characters. For a shortcut character string containing more than one character, the identified series can include at least about 5 characters, or at least about 10 characters, or at least about 15 characters. Alternatively, the identified series can include at least about 3 times as many characters as the shortcut string, or at least about 4 times as many characters, or at least about 5 times as many characters. Still another option can be to have the identified series include at least one separator character, or at least two separator characters, or at least three separator characters, or at least as many separator characters in the identified series as the total number of characters in the shortcut string.

In some embodiments, a series of characters can be identified for association with a shortcut string based in part on a relative frequency of occurrence of the series. Note, however, that a series could be identified for association with a shortcut character string for other reasons. For example, a series could be desirable for association with a shortcut, but the frequency of the series could be low due to the length of the series. A shortcut character could be associated with such a series of characters to allow users to use the series of characters without concern for consuming too many characters in a limited character format.

Shortcut Character String Dictionary

In various embodiments, replacement of a longer series of characters by a shortcut character string can be facilitated by using a dictionary of shortcut characters (or character strings). A shortcut character string dictionary can include one or more series of characters that have been identified for replacement with a shortcut. The shortcut character string associated with an identified series can also be included in the dictionary. The dictionary can then be used by the sender and the recipient to convert a longer message into a shorter message, and then back again so that the recipient sees the full message.

A shortcut dictionary can be provided to a user by any convenient method. One option can be to include a standard shortcut dictionary with a device at the time of sale. Another option can be to provide a shortcut dictionary as part of an update that is pushed out to mobile devices by a service provider. Still another option can be for two or more message service users to agree on a dictionary that is used only for messages between the group members. In such an embodiment, each group member can construct a dictionary based on a common set of rules and data, or one group member can construct a dictionary and provide the dictionary to the other members. More generally, any method for providing or distributing a shortcut dictionary can be used, so long as both the sender and the recipient have compatible dictionaries that allow for accurate reproduction of a message for the recipient. For example, in an alternative embodiment, two users could have shortcut dictionaries for use when sending messages to each other. Due to differences in personality, each user commonly types different phrases. Thus, the pair of users could have two separate shortcut dictionaries for handling messages between the users. One shortcut dictionary would be used for messages sent from user A to user B, while the other shortcut dictionary would be used for messages sent from user B to user A. In this scenario, both users would need the two different shortcut dictionaries, but the users would gain the advantage of having additional shortcut characters available to further decrease the length of the actually transmitted messages between the users. As a further alternative, the shortcut dictionary for user A can be used for messages sent to more than one other user. In such an alternative, the shortcut characters strings included in the dictionary for user A can be based on messages sent to a plurality of users. Each of the plurality of users could have a copy of the dictionary for user A, while user A could have a corresponding shortcut dictionary for receiving messages from one or more of the plurality of users.

In yet another option, a user may be able to receive messages including shortcut character strings without taking advantage of the capability to send such messages. For example, user A can have a shortcut dictionary based on the messaging tendencies of user A. User C can have a copy of the shortcut dictionary for user A. This allows user C to receive messages from user A that contain shortcut character strings. However, user C may not have a shortcut dictionary that reflects the tendencies of user C. In this situation, the messages sent from user C to user A may not involve shortcut character strings.

Replacement of Series of Consecutive Characters and Shortcut Character Strings

A shortcut character dictionary can be used to facilitate replacement of series of consecutive characters in a message that will be sent, and then conversion of the message back to its full text. A character replacement module or character encoder/decoder can be used to perform this function.

In an embodiment, a character replacement module can analyze a message that is ready to be sent, such as an SMS text message. The message can be analyzed to identify series of characters that match a series from the shortcut dictionary. If a matching series is found, the matching (or identified) series can be replaced with the associated shortcut character string. The analysis can continue until the end of the message is reached. After the analysis is completed, the message including the shortcut replacement strings can be encoded according to the standard character set, such as 7-bit ASCII encoding. The encoded message can then be sent to a recipient in the manner of any other message. When the recipient's device receives the message, the message can be decoded to convert the message back into characters. The message can then be analyzed again to identify any shortcut strings. The shortcut strings can be replaced with the associated longer character string from the shortcut dictionary. The full message without shortcut replacements can then be displayed for the recipient.

In another embodiment, replacement of identified series with shortcut strings can occur as a message is being entered into a device by a user. In such an embodiment, as a user enters a message, the entered text can be analyzed. When a series matching an entry in the shortcut dictionary is identified, the identified series can be replaced with the associated shortcut string. Thus, replacement of identified series with shortcut strings can occur while more text is still being entered.

In another embodiment, a counter can also be provided while a user is entering a message to be sent. The counter can track how many total characters have been entered, or the counter can track the number of characters that are available within a limit, such as the single message limit of 160 characters for a CDMA SMS message. When a counter is used, the count can be adjusted as the user types in additional characters for the message. The count can also be adjusted when a replacement occurs with a shortcut string. Because a shortcut string is shorter than an associated series of characters, after a shortcut replacement the counter can reflect the additional characters that a user may enter while staying within a desired limit.

Dynamic Definition of Shortcut Dictionaries

In some embodiments, the entries in a shortcut dictionary can be defined based on tracking or analysis of message activity. Thus, rather than having a static list of shortcuts provided when a user acquires a mobile device, at least some dictionaries can be updated based on analysis of messages being sent and received.

One option can be to have user defined dictionaries for other users, such as for people that a user frequently sends messages to and/or receives messages from. For example, a pair of users that send messages to each other could develop a shortcut dictionary for use in messages sent between the pair of users. After a sufficient number of messages are sent between the users, the messaging devices of the users could identify series of characters and associate shortcut character strings. Alternatively, a user could define a group of one or more other users that should be used for preparing a shortcut dictionary. Optionally, the shortcut dictionary could be developed automatically for the pair or group of users. In these types of embodiments, a messaging device could have a number of different shortcut dictionaries to accommodate the various message pairs or groups involving the user.

Another option is to have a central server, or a group of central servers, prepare and distribute shortcut dictionaries to users. In such an embodiment, messages being sent between users can be monitored. The series of characters in the messages can be tracked, and commonly occurring series can be identified. The commonly occurring series can be associated with shortcut characters to form a shortcut dictionary. The resulting shortcut dictionary can then be pushed to the various network users that employ the shortcut dictionary. For example, the group of users receiving the shortcut dictionary could be all users that have wireless messaging service provided by a given provider.

A blend of dynamic and static entries in the shortcut dictionary can also be used. For example, in some messaging services, the e-mail address (or another manner of specifying an identity) of the sender and/or the recipient can be included in the character limit for a message. As a result, many messages can include a series of characters such as "@messagevendor.com". In this type of situation, a shortcut character string can be associated with the fixed part of the e-mail address for any vendors that have large subscriber bases. This can be done to avoid having to analyze the portion of the message containing the e-mail address. Other shortcut strings can then be assigned dynamically.

Identifying series of characters that can be associated with shortcut strings can be performed in any convenient manner. One option is to manually associate series of characters with shortcut strings. For dynamic dictionaries, an automated method of association can be used.

One example can be building a dynamic dictionary for use by a pair of users. For illustration purposes, in this example the shortcut character string can be limited to a single character, selected from characters not included in the standard keyboard characters shown in Table 1. The series of characters for association can be limited to single words that contain five or more characters. Words can be defined as a series of characters that are separated by a "space" as a separator. In this type of embodiment, each message sent between the pair of users can be analyzed. The messages can be analyzed to track the number of occurrences of words with five or more characters. The number of instances for each word with five or more characters can be stored in a tracking log. After a threshold number of messages, the information in the tracking log can be reviewed. The series of characters having the highest number of instances can be associated with available shortcut characters. The messaging devices for the pair of users can then communicate to confirm that each device has the update to the shortcut dictionary.

Note that the series of characters can be analyzed for tracking purposes at any convenient point. Thus, the series of characters can be analyzed while the message is in character form or while the message is in character form but after replacement of character strings with shortcut strings. Alternatively, the messages can be analyzed after encoding of the message into a character encoding, such as 7-bit ASCII encoding. If messages are analyzed after replacement with shortcut strings or after encoding, the existing shortcut dictionary can be used to allow for tracking of any replaced series of characters in the message.

In another example, a server (or a group of servers) for a messaging service can create a dynamic dictionary. For purposes of illustration, in this example a shortcut character string can contain up to two characters, with at least one character being an extended keyboard character. In this example, the series of characters for replacement has at least 4 times as many characters as the associated shortcut character string, and the series of characters for replacement can include up to 3 words. In this example, the server is involved in receiving and transmitting messages from a sender to a recipient. As the server forwards a message, the message content can be analyzed to identify character strings.

In the embodiments described above, updates to a dictionary are described as occurring after a threshold number of messages. In such an embodiment, an update to a dictionary can be made after any convenient number of messages is received. The number of messages between updates can be at least about 1 or at least about 10, or at least about 100, or at least about 1000. In embodiments involving larger groups of users, the number of messages between updates could be larger still, such as at least about 10,000, or at least about 100,000, or at least about 1,000,000. Alternatively, updates to a dictionary could be based on another factor, such as the passage of an amount of time. Thus, a dynamic dictionary could be updated after about 1 day, or after about 10 days, or after about 100 days. In still other embodiments, any other convenient method for selecting a period between updates can be used.

In some embodiments, updates to a dynamic dictionary can also be used to stop or break an association between a series of characters and a shortcut string. For example, a word or phrase may temporarily become popular for use in messaging. When the word or phrase becomes popular, a shortcut string can be associated with the word or phrase. After a period of time, use of the word or phrase can decline, resulting in the word or phrase having less frequent use relative to other words or phrases. At that point, the association between the word or phrase and the shortcut string can be broken. This allows the shortcut string to be associated with another word or phrase.

Additional Embodiments

Embodiments of the present invention may be embodied as, among other things: a method, system, or set of instructions embodied on one or more computer-readable media. Computer-readable media include both volatile and nonvolatile media, removable and nonremovable media, and contemplate media readable by a database, a switch, and various other network devices. By way of example, and not limitation, computer-readable media include media implemented in any method or technology for storing information readable by a computing device. Examples of stored information include program modules including instructions, data structures, other data representations, and the like. Media examples include, but are not limited to information-delivery media, RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data momentarily, temporarily, or permanently. In an embodiment, the computer readable media can be tangible computer readable media. In another embodiment, the computer readable media can be non-transitory computer readable media.

Turning now to FIG. 1, a block diagram of an illustrative mobile computing device ("mobile device") is provided and referenced generally by the numeral 100. Although some components are shown in the singular, they may be plural. For example, mobile device 100 might include multiple processors or multiple radios, etc. As illustratively shown, mobile device 100 includes a bus 110 that directly or indirectly couples various components together including memory 112, a processor 114, a presentation component 116, a radio 117, input/output ports 118, input/output components 120, and a power supply 122.

Memory 112 might take the form of one or more of the aforementioned media. Thus, we will not elaborate more here, only to say that memory component 112 can include any type of medium that is capable of storing information in a manner readable by a computing device. Processor 114 might actually be multiple processors that receive instructions and process them accordingly. Presentation component 116 includes the likes of a display, a speaker, as well as other components that can present information (such as a lamp (LED), or even lighted keyboards).

Radio 117 represents a radio that facilitates communication with a wireless telecommunications network. Illustrative wireless telecommunications technologies include CDMA, GPRS, TDMA, GSM, and the like. In some embodiments, radio 117 might also facilitate other types of wireless communications including Wi-Fi communications and GIS communications.

Input/output port 118 might take on a variety of forms. Illustrative input/output ports include a USB jack, stereo jack, infrared port, proprietary communications ports, and the like. Input/output components 120 include items such as keyboards, microphones, touch screens, and any other item usable to directly or indirectly input data into mobile device 110. Power supply 122 includes items such as batteries, fuel cells, or any other component that can act as a power source to power mobile device 110.

Figure 2:
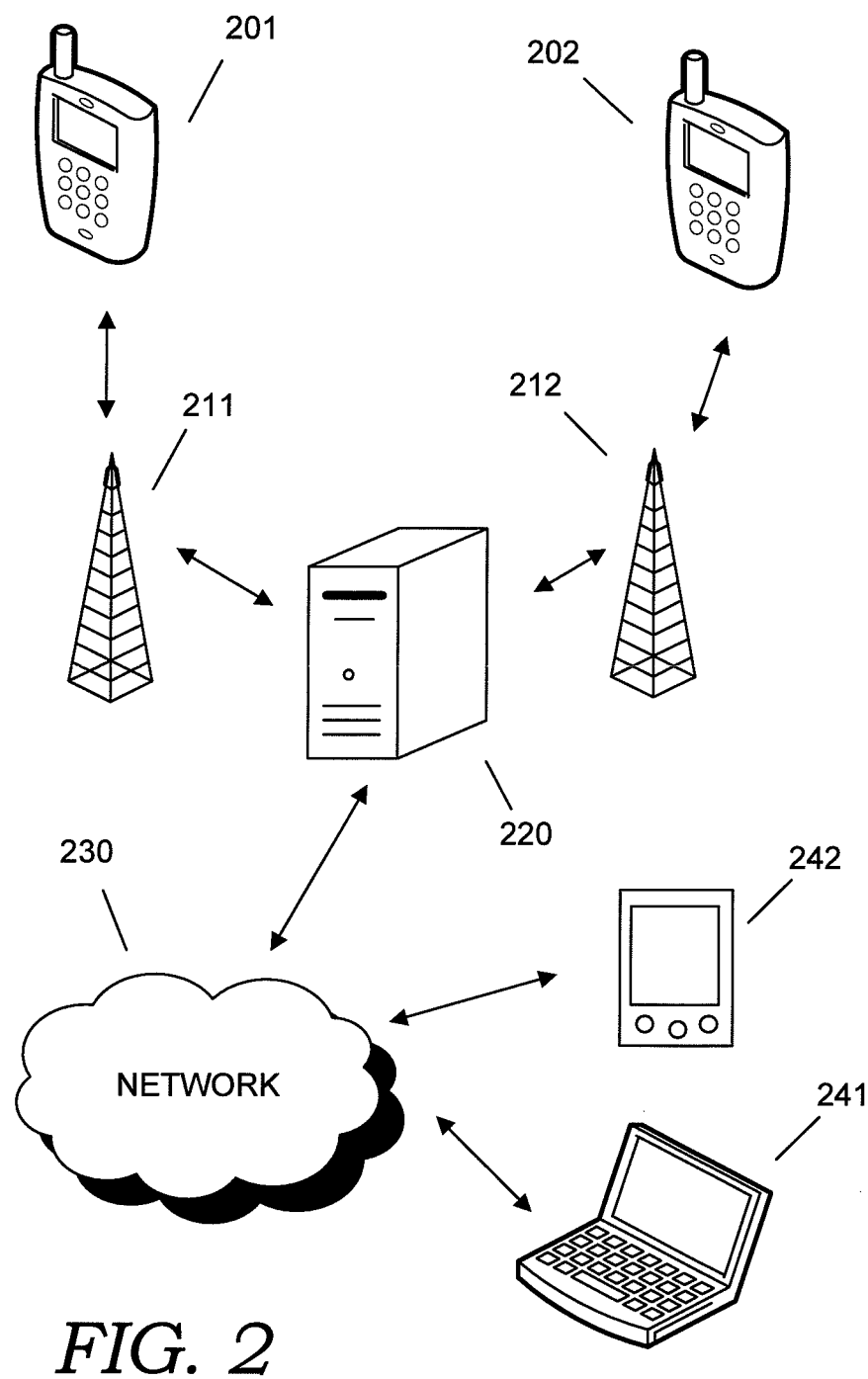
FIG. 2 schematically shows a system suitable for performing an embodiment of the invention.

FIG. 2 shows a simplified representation of network for delivering messages, such as short message service messages, between devices. In FIG. 2, a sending mobile device 201 and a recipient mobile device 202 are depicted. Mobile devices 201 and 202 communicate with messaging server 220 via wireless stations 211 and 212. It is understood that mobile devices 201 and 202 (and wireless stations 211 and 212) are representative, and that an arbitrary number of mobile devices and/or wireless stations can be involved in sending and/or receiving of messages. Note that wireless stations 211 and 212 are shown as being directly connected to messaging server 220 for convenience. Wireless stations 211 and 212 can be connected to messaging server 220 via a network (not shown). Alternatively, some message services provide for delivery options that would allow for sending or receiving of a message at a desktop computer, laptop computer, a handheld computer, a personal data assistant, or another type of device. For example, a messaging interface could allow a person to authenticate on identity using a desktop computer with access to a wide area network. The potential for use of these other devices is represented in FIG. 2 by computing device 241 and handheld computing device 242, which connect to messaging server 220 via network 230. Network 230 can be, for example, a wide area network (such as the world wide web), a local area network, or any other convenient network.

Figure 3:
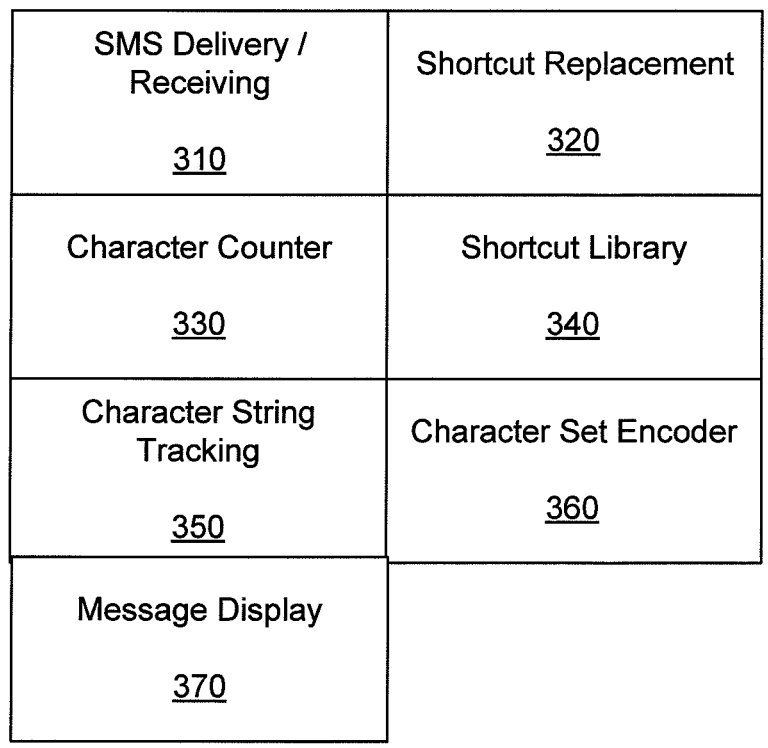
FIG. 3 schematically shows components for a system suitable for performing an embodiment of the invention.

FIG. 3 depicts system components that can be included in a mobile device or phone, a handheld computing device, a laptop computing device, or another device operating in accordance with an embodiment of the invention. In FIG. 3, a sending and receiving component or interface 310 can handle the transmission and receipt of messages by the device, such as sending and receiving of short message service messages. Message display component 370 can render a message being entered by the user for sending or a received message on a display for the messaging device. Character set encoding component 360 can handle encoding and decoding of messages. For example, a message typed in by a user can be encoded in a 7-bit or 8-bit ASCII encoding, depending on the type of message service that will be used for sending the message. Shortcut library 340 contains a listing of shortcut character strings that are associated with a series of consecutive characters. Shortcut replacement component 320 can use the listing in shortcut library 340 to identify matching series of consecutive characters in a message for sending and/or matching shortcut character strings in a received message. Character counter 330 can provide a count of the total number of characters in a message being entered by a user for sending. The count can be a running count that displays (via message display component 370) the increases in character count as a user enters characters. Any decreases in character count can also be displayed when one or more series of characters are replaced with shortcut character strings. Alternatively, the count can be kept without display, with only the final character count displayed to the user after any shortcut replacements. Character string tracking component 350 is an optional component that can be used to identify potential series of consecutive characters for association with a shortcut character string. Character string tracking component 350 can operate on messages for sending, received messages, or both. The character string tracking component 350 can operate on messages before or after any shortcut replacements, and before or after any character set encoding.

Figure 4:
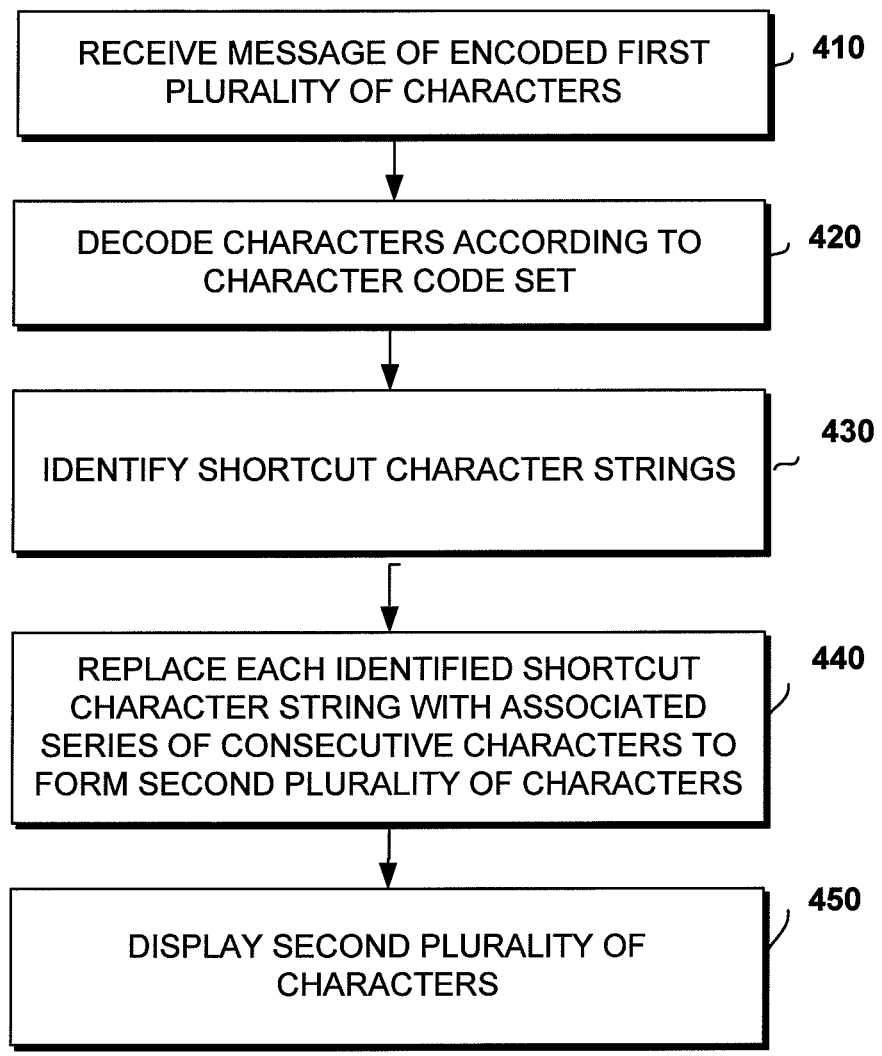
FIGS. 4 and 5 show sample methods for receiving and sending messages according to an embodiment of the invention.

FIGS. 4 to 7 provide flow charts of methods that can be used according to various embodiments of the invention. In FIG. 4, a flow chart is provided for one example of receiving a message involving a shortcut character string. A message can be received 410 that includes a plurality of encoded characters. The received characters can be decoded 420 according to a character code set. For example, the received characters may be 7-bit or 8-bit ASCII encoded characters that can be decoded to their corresponding characters. Shortcut character strings can also be identified 430 in the received plurality of characters. This identification can be performed either before or after decoding of the characters. The identified shortcut character strings can be replaced 440 with an associated series of consecutive characters. For example, a shortcut library can be used that contains a listing of shortcut character strings and the corresponding series of consecutive characters that is represented by the shortcut character string. In the embodiment shown in FIG. 4, replacing each shortcut character strings with the corresponding series of consecutive characters results in formation of a second plurality of characters. This second plurality of characters will contain more characters than the received plurality of characters. As with identification, the replacement of shortcut character strings can occur before or after decoding. Finally, the decoded second plurality of characters can be displayed 450. This can correspond to being displayed to a user on the user's mobile device, or on a user's computer, or any other convenient display device. In an embodiment, the decoded second plurality of characters corresponds to the characters that were originally entered by the sender of the message.

Figure 5:
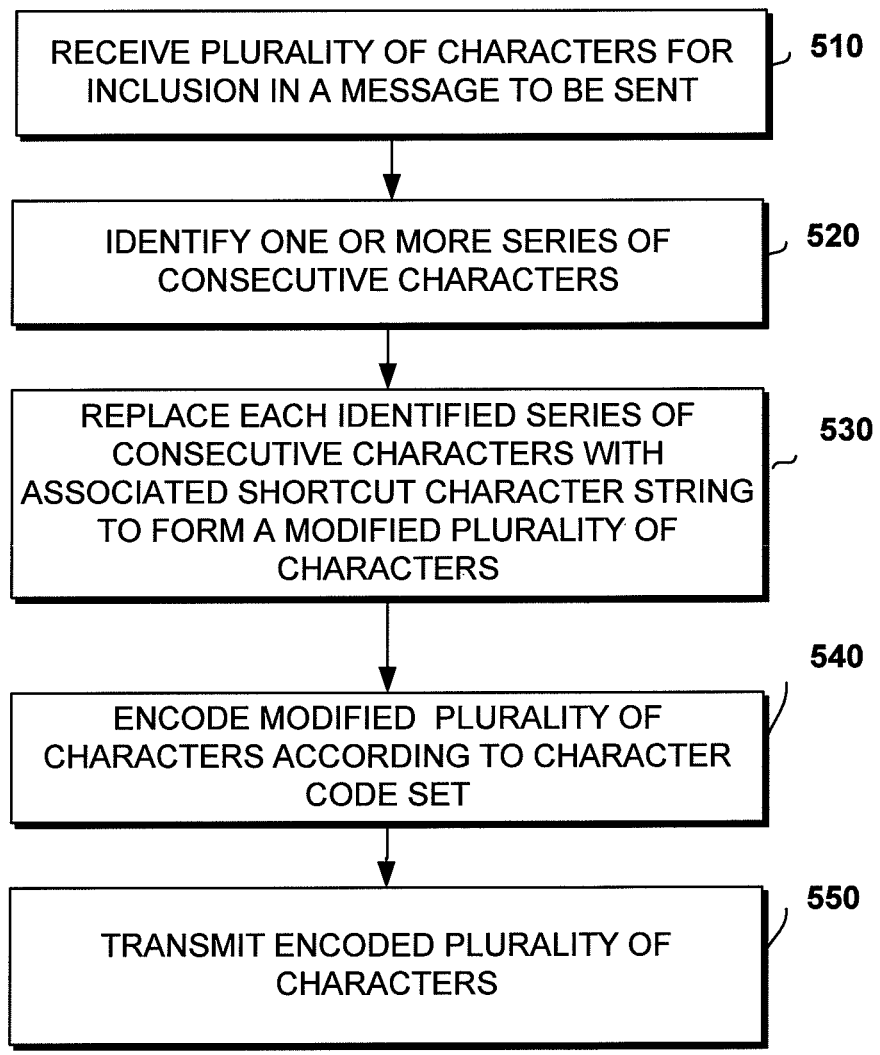

FIG. 5 shows an example of a method for sending a message according to an embodiment of the invention. In FIG. 5, a plurality of characters is received 510 for inclusion in a message to be sent. One or more series of consecutive characters can be identified 520. The identified series of consecutive characters can correspond to series of characters that have an associated shortcut character string. The identified series of consecutive characters can then be replaced 530 with the associated shortcut character string. This results in a modified plurality of characters. The modified plurality of characters will contain fewer characters than the received plurality of characters. The modified plurality of characters can be encoded 540 according to a character code set, such as an ASCII code set. Note that the encoding can occur either before or after replacement of the identified series of consecutive characters. The encoded modified plurality of characters can then be transmitted 550. In an embodiment, the method in FIG. 5 can be performed either prior to or after the method in FIG. 4. For example, if the method in FIG. 5 is performed after the method in FIG. 4, the received plurality of characters for inclusion in a message to be sent could be considered as a third plurality of characters. The modified plurality of characters, after replacement of identified series of consecutive characters, could be considered as a fourth plurality of characters.

Figure 6:
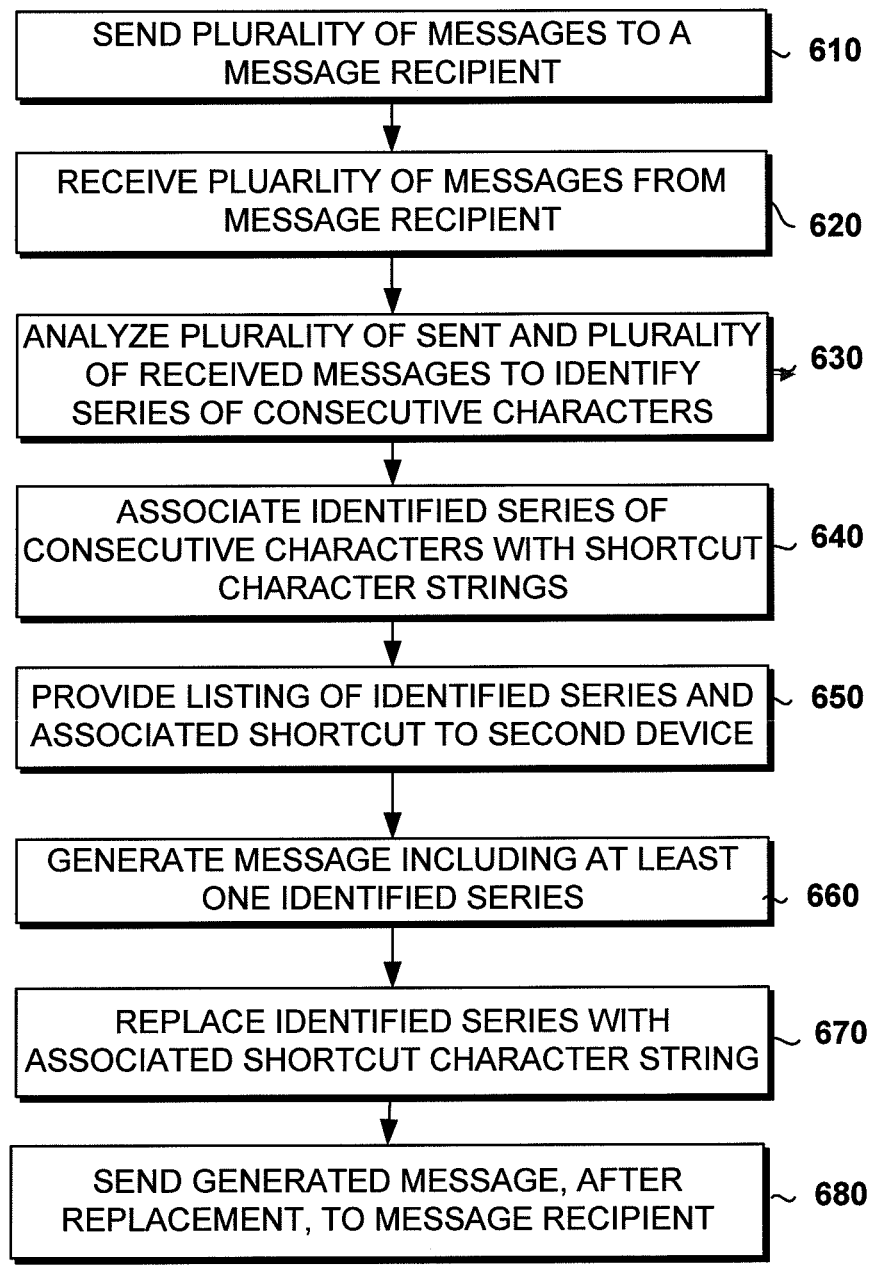
FIG. 6 shows a sample method for sending messages according to an embodiment of the invention.

FIG. 6 provides an example of a method for forming a dynamic dictionary and sending messages between a pair of messaging devices or a small group of such devices. In FIG. 6, a plurality of messages can be sent 610 to a message recipient. These can be messages from a device to a device, from an identity at a message interface to another identity, or a combination thereof. Optionally, this can be expanded to include messages sent to as many additional devices/identities as may be in a group, such as a user-defined group. A plurality of messages can also be received 620 from the message recipient, and/or from other members in a group. The plurality of sent and received messages can then be analyzed 630 to identify series of consecutive characters. The series of consecutive characters can be identified based on the length of the series, the frequency of occurrence of the series, or any other convenient metric or reason for identification. Each identified series of consecutive characters can then be associated 640 with a shortcut character string. A listing of the identified series of consecutive characters and the associated shortcut character strings can be provided 650 to the message recipient, and/or the other members in the messaging group. A message is then generated 660 that includes at least one of the identified series of consecutive characters. The at least one identified series of consecutive characters can be replaced 670 with the associated shortcut character string. The generated message, after replacement, can be sent 680 to the message recipient, and/or to other members in the messaging group.

Figure 7:
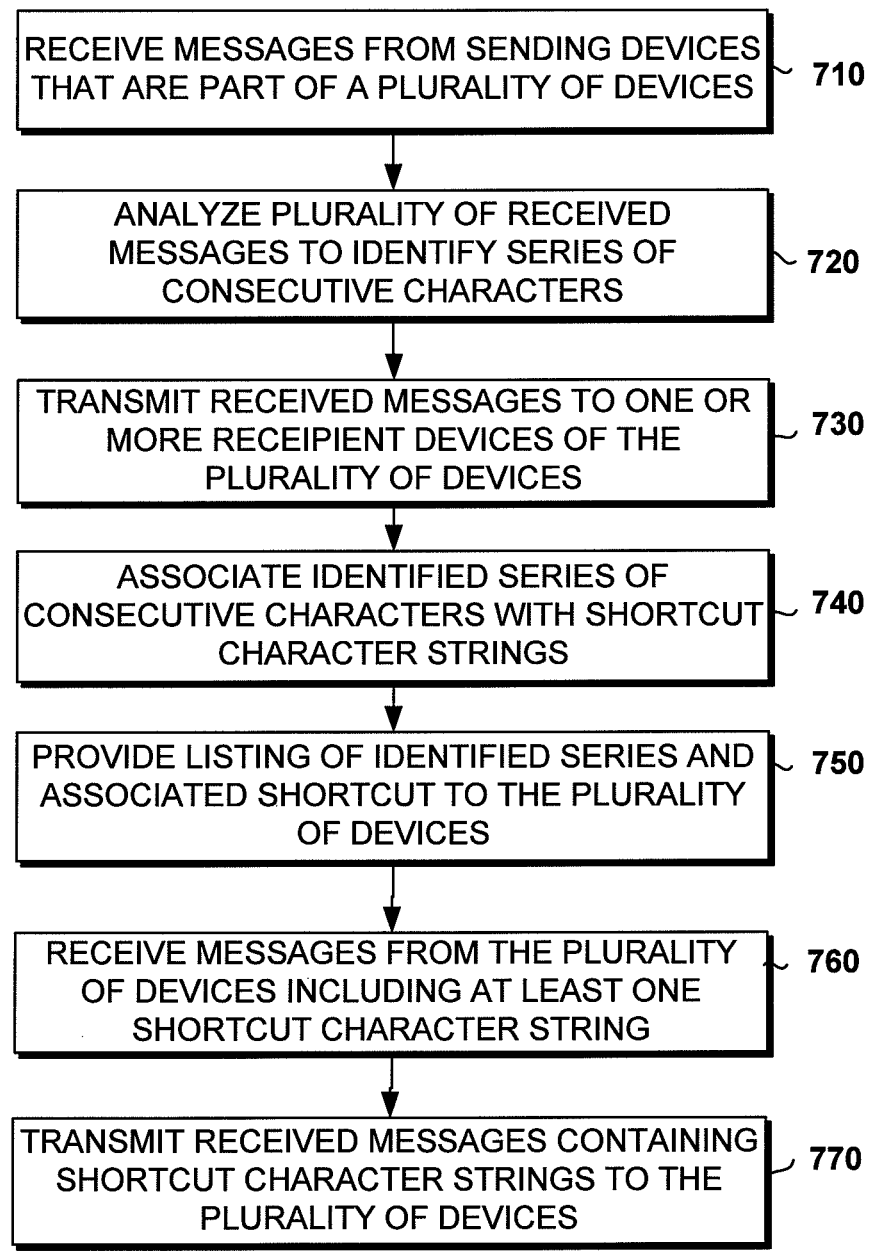
FIG. 7 shows a sample method for sending messages according to an embodiment of the invention.

FIG. 7 provides an example of a method for generating a dynamic dictionary by a server or other centralized computer that handles the routing of message traffic between sending and receiving devices and/or interfaces. In FIG. 7, messages can be received 710 from one or more senders from a plurality of messaging participants. The senders can be part of a plurality of messaging participants that are served by the server or other centralized computer. The plurality of received messages can be analyzed 720 to identify series of consecutive characters. The received messages can then be sent 730 to one or more recipients from the plurality of messaging participants. Optionally, messages that originate or terminate outside of the plurality of messaging participants could also be analyzed. The identified series of consecutive characters can be associated 740 with shortcut character strings. A listing of the identified series of consecutive characters and the associated shortcut character strings can then be provided 750 to the plurality of messaging participants. Messages can be received 760 from one or more of the devices/identities in the plurality of messaging participants that include a shortcut character string. The received messages containing a shortcut character string can be transmitted 770 to recipients in the plurality of messaging participants.

Figure 8:
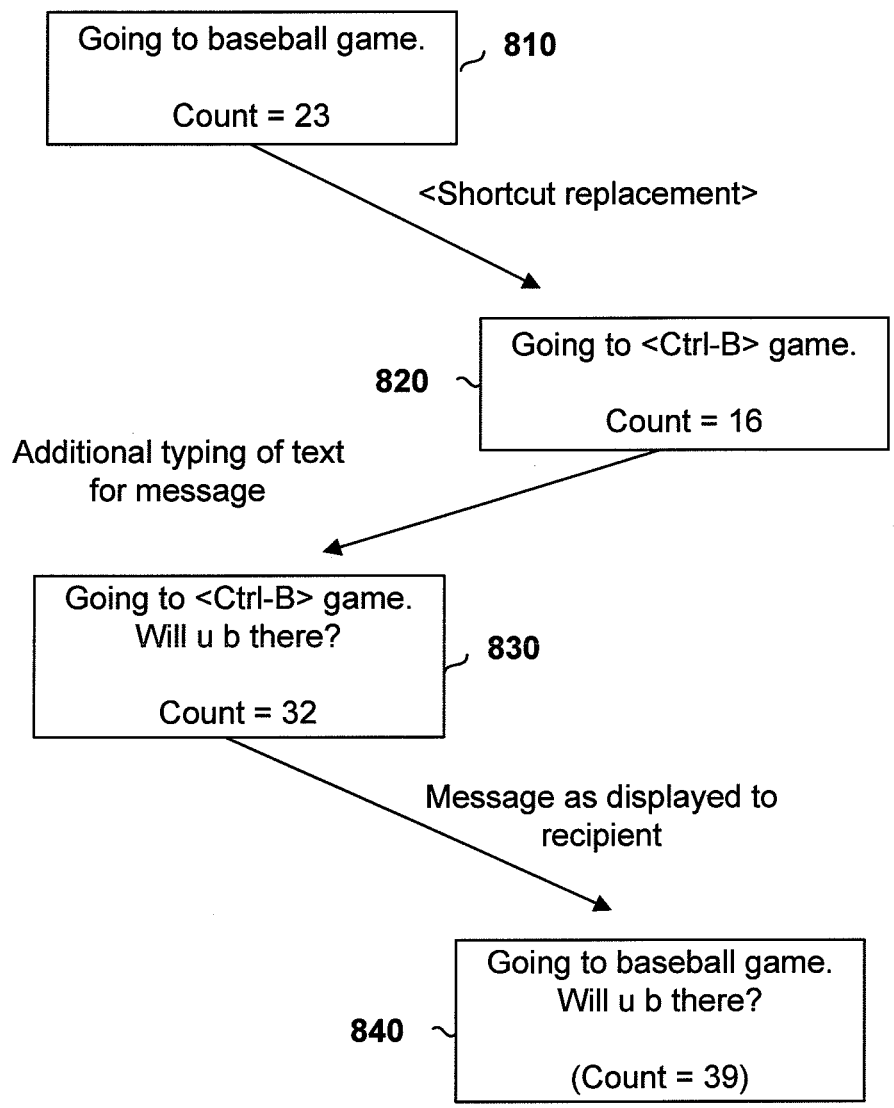
FIG. 8 shows an example of text displayed to a sender and a recipient according to an embodiment of the invention.

FIG. 8 shows an example of a message being entered for sending, and how a device (or messaging interface) receiving the message can process the message according to an embodiment of the invention. In FIG. 8, a user begins entering a message at 810. At some point during entry of the message, the user could see a display of the text "Going to a baseball game." While message entry is occurring, the total number of characters is tracked and displayed to the user for reference. At this point, 23 characters have been entered. Note that display of the count to the user is optional.

At 820, a replacement of an identified series of consecutive characters occurs. In FIG. 8, <Ctrl-B> is used to represent that the ASCII character control-B is the shortcut character string for the word baseball in this example. This corresponds to ASCII character number 2. This can be displayed to the user in any convenient manner. A symbol corresponding to <Ctrl-B> can be used, or the word baseball could be set off from the rest of the text in some way, such as placing brackets or slashes around the word. Because a replacement has occurred, the count has been reduced. Baseball contains 8 characters, while control-B represents only one character. Thus, the count has dropped from 23 to 16. In the example shown in FIG. 8, replacement occurred of baseball occurred after the user finished typing the next word. However, replacement could occur at any convenient time. For example, replacement could occur as soon as a string is identified. Alternatively, replacement could occur after a user has finished entering an entire message.

At 830, the user continues to enter the remainder of the message. As the user finishes the message, the user enters some shorthand notation, in the form of "u b" in place of "you be". This type of shorthand notation is not affected by the various embodiments of the invention. If a shorthand notation occurs frequently enough, such shorthand notation could possibly be identified for association with and replacement by a shortcut character. The user then indicates completion of the message, such as by hitting a "send" key. The message is then transmitted to a recipient at 840. The recipient receives a display of the full message, without any replaced text. Thus, even though the message sent by the sender included only 32 characters, the recipient receives display of a message containing 39 characters.

Still other embodiments of the invention can be contemplated. In an embodiment, computer-readable media can be provided having computer-executable instructions embodied thereon. The instructions, when executed, perform a method for processing a message. The method includes receiving a message comprising an encoded first plurality of characters. The encoded first plurality of characters is decoded according to a character code set. At least one shortcut character string is identified in the first plurality of characters. Each identified shortcut character string is replaced with an associated series of consecutive characters to form a second plurality of characters containing more characters than the decoded first plurality of characters. The second plurality of characters is displayed.

In another embodiment, computer-readable media can be provided having computer-executable instructions embodied thereon that extend the above embodiment. Alternatively, this extension can be performed separately as an independent embodiment. The extension of the method includes receiving a third plurality of characters for inclusion in a message to be sent. One or more series of consecutive characters are identified, each identified series of consecutive characters being associated with a shortcut character string. Each identified series of consecutive characters is replaced with the associated shortcut character string to create a fourth plurality of characters, the fourth plurality of characters containing fewer characters than the received third plurality of characters. The fourth plurality of characters is encoded according to the character code set. The encoded fourth plurality of characters is then transmitted.

In still another embodiment, a method for sending a message is provided. The method includes sending a plurality of messages to a message recipient. A plurality of messages are also received from the message recipient. The plurality of sent messages and the plurality of received messages are analyzed to identify one or more series of consecutive characters. Each identified series of consecutive characters is associated with a shortcut character string, the shortcut character string containing fewer characters than the associated identified series of consecutive characters. A listing of each identified series of consecutive characters and the associated shortcut character string is provided to the message recipient. A message containing a plurality of characters is generated, including at least one identified series of consecutive characters. The at least one identified series of consecutive characters is replaced with the associated shortcut character string. The generated message, after said replacing, is then sent to the message recipient.

In yet another embodiment, a method for processing messages is provided. The method includes receiving messages from one or more message senders that are part of a plurality of messaging participants. The plurality of received messages is analyzed to identify one or more series of consecutive characters. The received messages are transmitted to one or more recipients that are part of the plurality of messaging participants. Each identified series of consecutive characters is associated with a shortcut character string, the shortcut character string containing fewer characters than the associated identified series of consecutive characters. A listing of each identified series of consecutive characters and the associated shortcut character string is provided to the plurality of messaging participants. Messages from one or more of the plurality of messaging participants are received, the messages including at least one shortcut character string. The received messages are transmitted to one or more of the plurality of messaging participants.

Many different arrangements of the various components depicted, as well as components not shown, are possible without departing from the scope of the claims below. Embodiments of our technology have been described with the intent to be illustrative rather than restrictive. Alternative embodiments will become apparent readers of this disclosure after and because of reading it. Alternative means of implementing the aforementioned can be completed without departing from the scope of the claims below. Certain features and subcombinations are of utility and may be employed without reference to other features and subcombinations and are contemplated within the scope of the claims.

The invention claimed is:

1. One or more non-transitory computer-readable media having computer-executable instructions embodied thereon that, when executed, perform a method for processing a message, the method comprising:
   receiving, at a second device, a message from a first device, the message comprising an encoded first plurality of characters, wherein the encoded first plurality of characters are encoded based at least in part on a character code set of the first device;
   decoding, at the second device, the encoded first plurality of characters according to the character code set of the first device associated with a shortcut dictionary associated with the first device, wherein the shortcut dictionary comprises at least one shortcut character string having at least one character that is unavailable for entry via the first device keyboard having an ASCII character set, wherein decoding the encoded first plurality of characters comprises:
   referencing the shortcut dictionary that is dynamically updated based on one or more criteria in response to a predetermined number of a plurality sent and received messages, wherein dynamically updating the shortcut dictionary is based on:
   (1) analyzing at, at least one of, the first device and the second device, the plurality of sent and received messages between the first device and the second device;
   (2) identifying one or more series of consecutive characters included in the sent and received messages; and
   (3) associating the at least one identified series of consecutive characters with a shortcut character string having at least one character that is unavailable for entry via a standard device keyboard in the shortcut dictionary, the shortcut character string containing fewer characters than the associated identified series of consecutive characters;
   identifying at least one shortcut character string in the encoded first plurality of characters in the message based on the shortcut dictionary associated with the character code set of the first device;
   replacing, based on the shortcut dictionary, each identified shortcut character string with an associated series of consecutive characters to form a second plurality of characters containing more characters than the encoded first plurality of characters; and
   displaying the second plurality of characters.

2. The one or more non-transitory computer-readable media of claim 1, the method further comprising:
   receiving at the second device a third plurality of characters for inclusion in a second message to be sent;
   identifying one or more series of consecutive characters from the third plurality of characters, each identified series of consecutive characters being associated with a shortcut character string based on the shortcut dictionary;
   replacing, at the second device, each identified series of consecutive characters with the associated shortcut character string to create a fourth plurality of characters, the fourth plurality of characters containing fewer characters than the received third plurality of characters;
   encoding, at the second device, the fourth plurality of characters according to the character code set of the first device; and
   transmitting the second message to the first device comprising the encoded fourth plurality of characters.

3. The one or more non-transitory computer-readable media of claim 2, the method further comprising:
   displaying a counter of characters included in the second message to be sent;
   increasing the displayed count for each received character; and
   decreasing the displayed count after the replacement of each identified series of consecutive characters with the associated shortcut character string.

4. The one or more non-transitory computer-readable media of claim 3, wherein displaying the counter, increasing the displayed count, and decreasing the displayed count occur during receipt of additional characters in the third plurality of characters.

5. The one or more non-transitory computer-readable media of claim 1, wherein the second plurality of characters contains more than 160 characters.

6. The one or more non-transitory computer-readable media of claim 1, wherein the encoded first plurality of characters is received as a single message.

7. The one or more non-transitory computer readable media of claim 1, wherein the character code set is a 7-bit or 8-bit ASCII code set.

8. The one or more non-transitory computer-readable media of claim 1, wherein at least a first character of each shortcut character string is an expanded keyboard character which is unavailable for entry via the first device keyboard.

9. The one or more non-transitory computer-readable media of claim 1, wherein the encoded first plurality of characters is received as a short message service message.

10. The one or more non-transitory computer-readable media of claim 1, wherein the shortcut character string contains only one character.

11. The one or more non-transitory computer-readable media of claim 1, wherein each identified series of consecutive characters contains at least 5 characters.

12. The one or more non-transitory computer-readable media of claim 1, wherein each identified series of consecutive characters contains at least about four times as many characters as the associated shortcut character string.

13. The one or more non-transitory computer-readable media of claim 1, wherein at least one identified series of consecutive characters includes a separator character, the separator character being a space.

14. A method for sending a message, comprising:
sending a plurality of messages to a message recipient;
receiving a plurality of messages from the message recipient;
determining that the plurality of messages to the message recipient and the plurality of messages from the message recipient have met a message count threshold number;
upon the plurality of messages sent and the plurality of message received meeting the message count threshold number, analyzing the combination of both the plurality of sent messages and the plurality of received messages to identify recurring one or more series of consecutive characters such that a shortcut dictionary is dynamically generated based on one or more criteria using at least the message count threshold number of messages;
associating each identified series recurring of consecutive characters with a shortcut character string in the shortcut dictionary, the shortcut character string containing fewer characters than the associated identified series of consecutive characters;
providing at least a portion of the shortcut dictionary comprising a listing of each identified series of consecutive characters and the associated shortcut character string to the message recipient;
generating a subsequent message for the message recipient containing a plurality of characters, including at least one identified series of consecutive characters;
replacing the at least one identified series of consecutive characters with the associated shortcut character string based on the shortcut dictionary;
sending the generated message, after said replacing, to the message recipient.

15. The method of claim 14, wherein the shortcut character string includes at least one character that does not correspond to a standard keyboard character.

16. The method of claim 14, wherein analyzing the plurality of received messages further comprises analyzing at least one additional message received from a third messaging participant different from the message recipient.

17. The method of claim 16, wherein providing the listing of each identified series of consecutive characters and the associated shortcut character string further comprises providing the listing to the third messaging participant.

18. A method for processing messages, comprising:
receiving a plurality of messages at a central server from one or more message senders that are part of a plurality of messaging participants;
analyzing the plurality of received messages to identify one or more series of consecutive characters;
transmitting the received messages to one or more recipients that are part of the plurality of messaging participants;
associating, at the central server, each identified series of consecutive characters with a shortcut character string based on a shortcut dictionary, the shortcut character string containing fewer characters than the associated identified series of consecutive characters, wherein the central server is associated with the shortcut dictionary that is dynamically updated, based on one or more criteria, from a predetermined number of received and transmitted messages at the central server, and wherein the shortcut character string comprises at least one character unavailable for entry via a standard keyboard device;
providing at least a portion of the updated shortcut dictionary comprising a listing of each identified series of consecutive characters and the associated shortcut character string to the plurality of messaging participants for transmission of messages using shortcut character strings that substitute identified series of consecutive characters;
receiving messages from one or more of the plurality of messaging participants, each message including at least one shortcut character string; and
transmitting the received messages to one or more of the plurality of messaging participants.

19. The method of claim 18, wherein analyzing the plurality of received messages further comprises analyzing at least one additional message received from outside of the plurality of messaging participants.

20. The method of claim 18, wherein the shortcut character string includes at least one non-printable character.

* * * * *